United States Patent [19]
Nishizawa et al.

[11] 4,329,625
[45] May 11, 1982

[54] LIGHT-RESPONSIVE LIGHT-EMITTING DIODE DISPLAY

[75] Inventors: Jun-ichi Nishizawa; Yasuo Okuno; Keishiro Takahashi, all of Sendai, Japan

[73] Assignee: Zaidan Hojin Handotai Kenkyu Shinkokai, Sendai, Japan

[21] Appl. No.: 58,545

[22] Filed: Jul. 17, 1979

[30] Foreign Application Priority Data

Jul. 24, 1978 [JP] Japan .................................. 53-90619

[51] Int. Cl.³ .......................................... H05B 43/00
[52] U.S. Cl. ..................................... 315/158; 307/311;
315/53; 315/152; 315/192; 315/311; 315/312;
362/800
[58] Field of Search ................................. 315/152–156,
315/158, 159, 134, 185 R, 185 S, 189, 190, 192,
193, 312, 313, 324, 311, 53, 169.1, 297; 340/762,
782, 793, 84, 718, 719; 307/311; 58/23 R, 50 R;
362/800; 250/214 AL; 368/83, 205, 241

[56] References Cited

U.S. PATENT DOCUMENTS

| | | | |
|---|---|---|---|
| 3,757,511 | 9/1973 | Burgess et al. | 368/205 X |
| 3,911,423 | 10/1975 | Arndt et al. | 315/153 X |
| 4,029,991 | 6/1977 | Schultz | 315/291 X |
| 4,114,366 | 9/1978 | Renner et al. | 315/156 X |
| 4,182,977 | 1/1980 | Stricklin | 315/158 |
| 4,211,955 | 8/1980 | Ray | 315/53 |

OTHER PUBLICATIONS

Nishizawa et al., Bipolar Mode Static Induction Transistor (BSIT)–High Speed Switching Device, IEDM Dec. 1978, pp. 676-679.

*Primary Examiner*—Eugene R. La Roche
*Attorney, Agent, or Firm*—Cushman, Darby & Cushman

[57] ABSTRACT

A light-responsive light-emitting diode display comprises a light-emitting diode circuit including a series connection of light-emitting diodes and a light-responsive current-controlling circuit connected in series to said light-emitting diode circuit for supplying a current thereto in correspondence with the ambient brightness. A unipolar photo-transistor can provide a current above a predetermined minimum value and increasing with the intensity of incident lights and can absorb excess voltages when applied. Light-responsive current-control reduces the useless power dissipation, and all solid-state display provides a very long service life.

19 Claims, 20 Drawing Figures

LIGHT-RESPONSIVE LIGHT-EMITTING DIODE DISPLAY

RELATED APPLICATION

Reference is made to the related copending application of Okuno (one of the present inventors) Ser. No. 52,014 filed June 25, 1979.

BACKGROUND OF THE INVENTION (a) Field of the Invention

The present invention relates to light-emitting display, and more particularly it pertains to light-responsive light-emitting diode display to be used in such places where ambient brightness varies largely.

(b) Description of the Prior Art

Many of the conventional outdoors-installed colored-light display devices (hereinafter to be referred simply to simply as display devices) have employed a combination of an incandescent lamps and colored glass or plastic plates, or gas-filled discharge tubes which emit colored-lights. Traffic signal lamps are typical examples of the former, and neon signs are typical examples of the latter. Ordinary gas-filled discharge tubes have weak light outputs and it is difficult for the viewer to obtain clear recognition of such lights under daytime sunlight. Besides, gas-filled discharge tubes have limited service lifetime. These are considered to be the essential drawbacks of the gas-filled discharge tubes, and no striking improvement in their ability can be expected. Accordingly, combinations of incandescent lamps and filters such as colored glass plates have generally been used for display devices as traffic signals which are required to perform display operations outdoors day and night.

Fluorescent lamps have a higher electric power-to-light conversion efficiency than do incandescent lamps. However, the former have such drawbacks as larger size, lower brightness and slower lighting-up action as compared with incandescent lamps, as well as the inconvenience of requiring a power supply source for their exclusive use. It is for these reasons that fluorescent lamps are typically not used for many purposes other than for providing continuous illumination.

Accordingly, incandescent lamps are employed in many of those colored-light displays designed to perform alternating displays within a limited area on the display device, as in traffic signal devices.

In order to provide a distinctive colored-light display in places where ambient brightness undergoes substantial changes, it is necessary that the light-output always be capable of coping with the ambient brightness, where an incandescent lamp is used, the light-output is determined mainly by the temperature and the surface area of the light-emitting portion (filament). Therefore, if the supply electric voltage is reduced, this will cause a drop in the temperature of the filament, and will bring about a sudden drop in the light-output or a change in color temperature. Thus, it is not easy to adequately control the light-output of an incandescent lamp in accordance with the changes in the ambient brightness. If the light-output is fixed to provide a fixed constant brightness, it is necessary to design the display device provide a distinctive display when the ambient light is at its maximum brightness. By so arranging the display device, however, the device will naturally perform display which will greatly exceeds the brightness which is required when the ambient light has become dark. Such unnecessary consumption of electric power would be tremendous even when traffic signal lamps alone are considered. Thus, improvement of such devices of the prior art has been desired and demanded not only by the society in general but also by the users of display devices.

As such, an improvement in the electric power-to-light conversion efficiency of colored-light display devices is desired, as well as an adequate and easy control of the amount of emitting lights.

Semiconductor light-emitting diodes have made a remarkable progress in their efficiency. The intensity of their emitting lights have now become to be substantially proportional to the value of the current flowing therethrough, and bright displays can be provided even by low-current operations. Moreover, light-emitting diodes have an average service lifetime of much longer than 100,000 hours. As such, it is very desirable that almost all those colored-light display devices which are presently being used outdoors be replaced by those display devices using light-emitting diodes from the viewpoints of energy-saving and long service life.

Most of the colored-light displays can be performed with the three colors, i.e. red, yellow and green (blue). High-efficiency light-emitting diodes emitting red, yellow and green colors, respectively, can be manufactured by arranging their light-emitting regions with, for example, $Ga_{0.7}Al_{0.3}As$, $GaAs_{0.7}P_{0.3}$ or $InGaAsP$ for red color emission, $In_{0.6}Ga_{0.4}P$, or $Al_{0.4}In_{0.6}P$ for yellow color emission, and $GaP$, or $In_{0.7}Ga_{0.3}P$ or $Al_{0.5}In_{0.5}P$ for green color emission, respectively. It is needless to say that light-emitting diodes which are capable of emitting lights having wavelengths different from those of said three colors mentioned above can be manufactured as well. At the present stage, the diodes which emit blue color have a much lower efficiency, but a remarkable hike in their light-emitting efficiency can be expected. It has been already proved by, for example, the so-called temperature difference method under controlled vapor pressure (TDM-CVP) that a light-emitting diode can be obtained having a very high efficiency if the compositional ratio of the respective regions of a light-emitting diode having a multi-layer hetero-junction structure is held under strict control and if lattice alignment between the respective adjacent regions is performed to grow crystals having few defects. Techniques have advanced so far that the colors of lights emitted from light-emitting diodes cover almost the entire visible range. Therefore, it is possible to select of any arbitrary combination of these diodes to suit a given purpose.

Even when those colored light display devices using incandescent lamps as their light sources are replaced by display devices using light-emitting diodes, and the maintenance of the display devices has thus become simplified and the electric power consumption greatly reduced, there still remains the problem concerning the adjustment of intensity of light of the display devices for such place where ambient brightness varies largely. That is, operating the device at the same intensity, when the ambient light has become dark, as when ambient light is at its maximum brightness, will use electric power several times that which is really required for that period when the ambient light is much darker than the daytime.

SUMMARY OF THE INVENTION

It is, therefore, an object of the present invention to provide a light-emitting diode display device which provides a display with a sufficient brightness in good response to the ambient light.

The light-output of a light-emitting diode is substantially linearly proportional to the forward current, and also the spectrum characteristic of the emitting light is substantially independent of the value of the forward current. Accordingly, in case of an outdoor display device intended to perform display throughout day and night, the electric power which is required to obtain a brightness of the emitting light during the night time, i.e. a brightness of one severalth of that required for the daytime, can be only a fraction of the electric power required for the daytime.

The light-output of a light-emitting diode can be controlled easily by controlling the current of the diode. If a light-responsive current-controlling circuit is connected in series to a circuit of light-emitting diodes in order to control the current, this arrangement will allow a large current to flow through the series connection when the ambient light is bright to thereby provide a bright display, whereas when the ambient light becomes dark, the current-controlling circuit will be able to operate so as to limit the value of the flowing current to thereby provide a lowered brightness of display.

A unipolar photo-transistor, in particular, can be designed so that it will allow a required amount of current to flow therethrough even when the incident light drops to zero. Therefore, the combination of a unipolar photo-transistor and a light-emitting diode circuit is able to provide a light-emitting display suitable for the ambient brightness by a simple structure.

If a plurality of light-emitting diode circuits are connected in parallel in a light-emitting device, it is possible to insert a bipolar photo-transistor or transistors in series with some of the light-emitting diode circuits. A bipolar photo-transistor is operative in such way that, when the incident light drops to zero, it cuts off the current to cause the particular light-emitting diode circuit to which the bipolar photo-transistor is connected in series to cease emission of light. As such, only those light-emitting diode circuits which are not connected with a bipolar photo-transistor will continue emission of lights.

It is also possible to use a photo-conductive element or a photo-diode to serve as a light-responsive current-controlling element. In such a case, however, another current limiting means which may be controlled by such photo-electric elements is necessary.

A light-emitting diode display device which is controlled by its current in response to the degree of the ambient light has a very high efficiency and has a markedly reduced consumption of electric power, and will provide colored light display of an extremely prolonged service lifetime.

Other objects, features and advantages of the present invention will become apparent from the detailed explanation of the preferred embodiments when taken in conjunction with the accompanying drawings.

BRIEF DESCRIPTION OF THE DRAWINGS

FIGS. 1A to 1E illustrate an embodiment of the present invention, in which:

DETAILED DESCRIPTION OF THE PREFERRED EMBODIMENTS

Light-emitting diodes have an extremely long service lifetime, and their light-emitting efficiency also has been improved remarkably of late. However, the operating voltage per light-emitting diode is low, and usually the amount of emitting light of the diode is small. Therefore, in order to obtain a large amount of light, it is necessary to use many light-emitting diodes. The voltage of the electric power supply source which is ordinarily used is of the order from about 10 V to about 200 V, and the voltage of commercial ac power supply source is about 100 V to about 220 V. Accordingly, in order to obtain a large amount of light from use of many light-emitting diodes, it is effective to connect a certain number of light-emitting diodes in series.

Figure 1A:
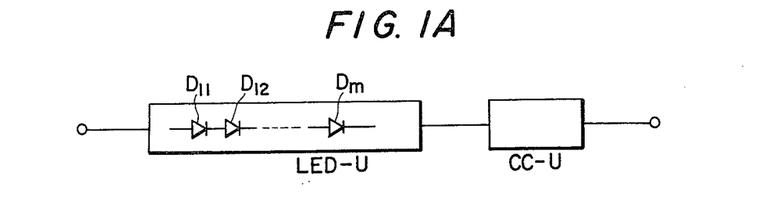
FIG. 1A is a circuit diagram of an incident light-responsive light-emitting diode display unit.

FIG. 1A shows a display unit according to an embodiment of the present invention. This display unit comprises a light-emitting diode unit LED-U including a series connection of a plurality of light-emitting diodes $D_{11}, D_{12}, -, D_{In}$, and a light-responsive current-controlling unit CC-U for controlling the current flowing through light-emitting diode unit LED-U. The light-responsive current control unit CC-U consumes a part of the voltage applied to the display unit to provide the light-emitting diode unit LED-U with a current corresponding to the ambient brightness. Those series-connected light-emitting diodes provided in the light-emitting diode unit LED-U are driven by a same current via the current-controlling unit CC-U.

Figure 1B:
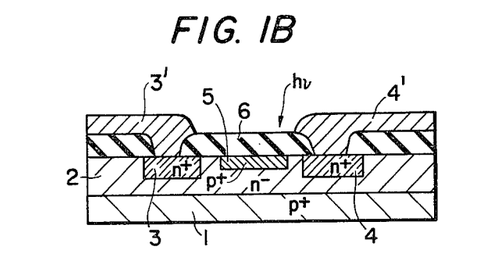
FIG. 1B is a schematic cross-sectional view of a unipolar photo-transistor to be used in the display unit of FIG. 1A.
Figure 1C:
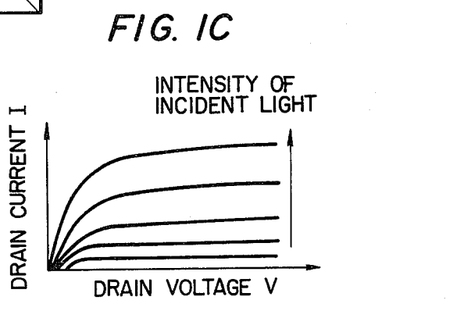
FIG. 1C is a schematic diagram showing the drain current versus drain voltage characteristic of the unipolar photo-transistor of FIG. 1B.
Figure 1D:
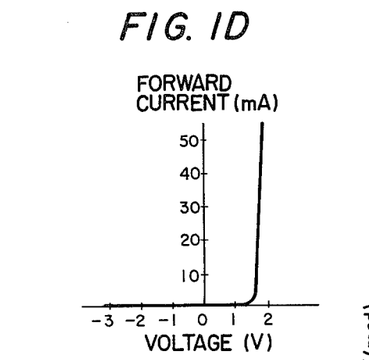
FIGS. 1D and 1E are diagrams showing the current versus voltage characteristic, and the luminous intensity versus forward current characteristic of a light-emitting diode.
Figure 1E:
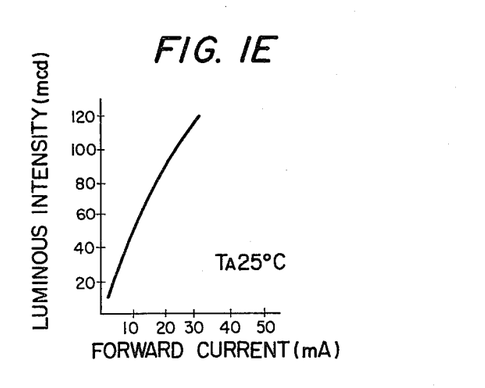

FIGS. 1D and 1E show examples of the characteristics of a light-emitting diode. As shown in FIG. 1D, the current through a light-emitting diode will rise sharply for a voltage above a certain value. Also, as shown in FIG. 1E, the luminous intensity of the light-emitting diode is substantially proportional to the value of current flowing therethrough. Therefore, in order to control the amount of the emitting light of the diode, it is necessary to control the value of the current. It should be understood also that the light-emtting diode is such that, even when the current value is varied, its operating voltage will undergo a substantially not change, as shown in FIG. 1D.

The number (n) of the light-emitting diodes which are connected in series in the light-emitting diode unit LED-U is selected so that the voltage for driving the display unit will have an appropriate value. It should be understood that the greater the number (n) of the series-connected diodes is, the higher the voltage for driving the light-emitting diode unit will become, and the smaller the number of the current-controlling units provided in the entire display can be. However, such arrangement will have the disadvantage that the number of those light-emitting diodes which will cease emission of lights if a particular light-emitting diode becomes broken or disconnected will increase.

The operating voltage of a visible light-emitting diode is in the range of about 1.5 to about 4 volts. The operating voltage of the light-emitting diode unit LED-U is dominated by the sum of the operating voltages of the respective light-emitting diodes. For example, in case a light-emitting diode display device is driven by a direct current of about 100 volts, the number of those light-emitting diodes which can be connected in series in a single light-emitting diode unit LED-U will be about 20 to 60 pieces. It should be understood that, because a light-emitting diode will hardly operate at a voltage below a certain level, it will be effective to determine the ratio of the voltage divided between the light-emitting diode unit LED-U and the current-controlling unit CC-U, while taking the magnitude of fluctuation of the supply voltage into consideration. In case current balancing is provided by means of, for example, resistors, it is also possible to control a plurality of series connection of light-emitting diodes by a single current-controlling circuit. Light-responsive current-controlling elements incude photo-conductive element, photo-diode and photo-transistor.

It should be noted that, for the protection of the light-emitting diode unit LED-U against fluctuating voltage of the power supply source, it is desirable to select a light-responsive current-controlling unit CC-U with as good a saturating characteristic as possible. A bipolar photo-transistor, a field effect photo-transistor and a bipolar-mode static induction photo-transistor invariably exhibit a saturating type current versus voltage characteristic, and are operative to increase the main current flow with an increase in the amount of incident light. In the circuit shown in FIG. 1A, if a field effect photo-transistor or a static induction photo-transistor is employed to serve as the light-responsive current-controlling element, a display unit which is driven by a predetermined current even when the incident light is zero can easily be obtained.

FIGS. 1B and 1C show a schematic sectional view and a schematic chart of characteristic of a field effect photo-transistor, respectively. In FIG. 1B, an $n^-$ type epitaxial layer 2 is grown on a $p^+$ type substrate 1 made of silicon. In this $n^-$ type layer 2, there are formed, by relying on the diffusion or ion implantation technique, an $n^+$ type source region 3, an $n^+$ type drain region 4 and a $p^+$ type gate region 5. On top of these regions is formed a transparent insulating film 6 having contact holes. Metal electrodes 3' and 4' are provided so as to be in contact with the source region 3 and with the drain region 4, respectively, via the contact holes. The thickness of the $p^+$ type gate region 5 is selected so that the incident light in the visible range is permitted to reach the $n^-$ type region 2 which constitutes a channel, without being subjected to a substantial attenuation. The transparent insulating film 6 provided on top of the gate region 5 constitutes the light-receiving portion. When a visible light $h\nu$ impinges onto the $n^-$ type region 2 after passing through the transparent insulating layer 6 and is absorbed in said $n^-$ type region 2, there are produced electron-hole pairs. These electrons are absorbed by either the source region 3 or the drain region 4 via the channel region 2. However, the positive holes will advance to the $p^+$ type gate region 5 in accordance with either the potential gradient in the depletion layer produced between the gate region and the channel region, or through diffusion, and are stored in the gate region 5. This gate region 5 becomes forwardly biased in proportion to the amount of the positive holes which are stored. In accordance with the amount of the forward biasing, the width of the depletion layer which extends from the gate region 5 to the channel region 2 is controlled, and the resistance of the channel which is formed in the remaining neutral region is controlled. That is, with an increase in the amount of the incident light, the depletion layer shrinks, and the width of the channel increases corresponding to the amount of such shrinking, and thus a larger current is allowed to flow. As a consequence, the amount of the emitting light of the light-emitting diode unit LED-U will increase. When the amount of the incident light is zero, there is formed, toward the inner portion of the channel region 2, a depletion layer due to the built-in (diffusion) potential between the $p^+$ type gate region 5 and the $n^-$ type channel region 2. Accordingly, the value obtained by subtracting from the width (thickness) of the channel region 2 the width of the depletion layer due to the built-in potential will be the width of the neutral channel region in the dark condition. The variation of the current at the time of receipt of the incident light will be determined substantially by both the width of the $n^-$ type channel region 2 and the impurity concentration of this region. It will be advantageous for a greater variation of current can be obtained by lowering the impurity concentration of said channel region below a certain level such as below $10^{16}$ cm$^{-3}$, since control in depth of doped regions on the order of 0.1 $\mu$m is rather difficult and since this lowering of impurity concentration of the channel region will bring about greater variation of the width of the depletion layer. Also, it will be advantageous for obtaining a better saturating characteristic to increase the length of the $p^+$ type gate region 5 and to thereby increase the series resistance between the source electrode and the pinch-off point in the channel region. However, too great an increase in the length of the gate region 5 will result in an increase in the "on" resistance, and accordingly will result in a decrease in the value of current. The value of current can be increased also by increasing the lateral width of the channel, i.e. the width in vertical direction relative to the sheet of drawing in FIG. 1B, but in such case the utility rate of the substrate will decrease. If the length of the channel is reduced, non-saturation of drain current will tend to occur. However, a reduction of the channel length will not introduce a great disaster if an extreme non-saturating tendency is ensured.

An electric charge (positive holes) stored in the gate region will forward bias this gate region. Accordingly, the stored electric charge will be discharged as a forward current of the photo-diode which is constituted by the gate region and the channel region and possibly also as a leakage current which can be considered to flow through the leakage resistance. The differential resistance of a forward biased diode will undergo great variation in accordance with the magnitude of the forward bias voltage. This forward differential resistance will be very great during the period in which the forward bias voltage is small. Accordingly, during the period in which th photo-diode allows almost no forward current to flow, the electric charge which is stored in the gate region will discharge through the leakage resistance. Accordingly, the discharge time constant in such period is determined substantially by the product of the capacitance C of the gate region and the leakage resistance R. The leakage resistance R is considerably large, and therefore the photo-transistor has a kind of integrating function, but the response of the diode to the variation of the amount of incident light may not be very quick. It should be understood that, in a display device installed outdoors, the variation of the ambient brightness is relatively gentle, and accordingly, the relatively slow response to the ambient light variation will not cause much problem in the responsiveness to light. Conversely, speaking on the basis of positively making use of the fact that the discharge time constant is large, it is also possible to prevent the occurrence of erroneous operation of the display device such that the display becomes dark due to hazardous partial interruption of the incident light when the general ambient light is still bright. Since the selection of the gate capacitance is substantially a matter of design, the selection can enjoy substantial freedom. However, since the gate current of a field-effect photo-transistor has no direct relationship with the drain current, the characteristic tends to become non-linear.

The light-receiving aperture (window) may be given a filtering function by means of, for example, forming the transparent insulating film 6 by alternating layers of a silicon oxide and a silicon nitride. By arranging the light-responsive current-controlling means so as to have a sensitivity curve almost identical with the sensitivity of human eyes, a more adequate control of the amount of emitting light of display can be provided.

Also, a resistance component may be positively formed between the gate region and the source region to decrease the value of leakage resistance. Such arrangement will cause the discharge time constant to become small, which will lead to quicker response to the variation of incident light.

The photoelectromotive force due to a diode structure is considered to have a substantially constant certain voltage and a current proportional to the amount of the incident light. If the leakage resistance is very large, the light-responsive current of the field effect photo-transistor tends to show a sharp rising in the region of small amount of light and to become saturated for higher intensity of incident light. If, however, a resistor is connected to this transistor to form a discharge path, the variation of the light-responsive current becomes gentle, approaching considerably a linear type variation.

In order to elevate the sensitivity to light of the device, it is effective to dispose a lens on top of the transparent insulating film 6 to focus the collected light rays onto the optically active region. A reduction of the impurity concentration of the channel region and a reduction of size of the gate region will be effective also for improving the sensitivity to light. Since it is easy to decrease the excess sensitivity to light by cutting some part of the incident light, setting the sensitivity to light at a high value is permissible from the viewpoint of designing. If a structure similar to that of known field effect transistor is adopted, the ratio between the effective channel cross sections when the width of the depletion layer is minimum and when it is maximum is selected at a desired value, and the structural parameters are selected so that the maximum value of current will assume a value sufficient for the display in daytime. In this way, there can be formed a field effect photo-transistor which will perform a desired control of current in response to the ambient light.

A field effect photo-transistor having such structure as mentioned above has the function to store those carriers which have been generated as a result of the incident light. The stored carriers will, in an amplified manner, control the main current flow, and accordingly such transistor has a high sensitivity to light, though somewhat slow in response.

The sensitivity to light of human eyes is not constant to various degrees of irradiation of light. Therefore, if the display device is arranged so that it will provide a certain constant light for an incident light having a brightness above a certain level, such arrangement will give no practical inconvenience. More particularly, arrangement may be provided so that the depletion layer in the field effect photo-transistor will shrink sufficiently for a certain threshold amount of incident light, and that the depletion layer will not exert any response to the incident light above that threshold amount.

Figures 2A, 2B:
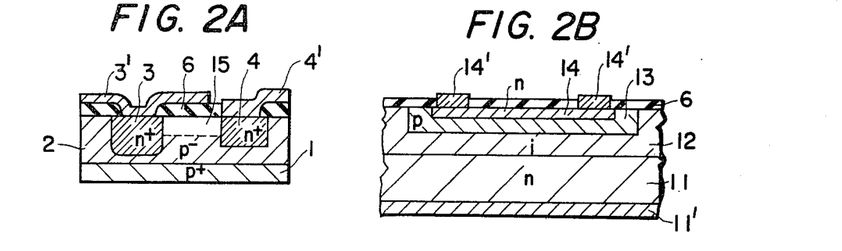
FIGS. 2A, 2B and 2C are schematic cross-sectional views of other examples of photo-transistors.
Figure 2C:
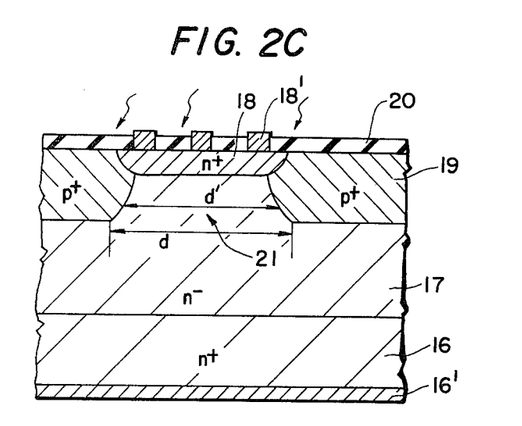

Other examples of light-responsive current-controlling transistor are shown in FIGS. 2A, 2B and 2C. FIG. 2A shows an insulated-gate type field effect photo-transistor. The structure of this transistor of FIG. 2A is such that a gate region is not provided in particular, but the insulating film provided on the p⁻ type channel region 2 is supplied with negative electric charge, so that an n type inversion layer 15 will be formed within the p⁻ type channel region 2'. Furthermore, there is provided a low resistivity polysilicon electrode 3' on top of the transparent insulating film 6 integrally with the source electrode, to thereby stabilize the potential of the channel region. Incident light passes through a light-receiving window which is constituted by the polysilicon film 3' and the transparent insulating film 6.

FIG. 2B shows an ordinary bipolar photo-transistor. A high resistivity i-type (or n⁻ type) epitaxial layer 12 is formed on an n type silicon substrate 11. A p type base region 13 is formed within the epitaxial layer 12, and an n type emitter region 14 is formed within the p type base region 13, by relying on either the diffusion technique or the ion-implantation technique. An annular emitter electrode 14' is formed on the emitter region 14, and a collector electrode 11' is formed on the substate 11. The emitter electrode 14' may have a mesh-shape or a stripe-shape in addition to said annular shape. Also, this emitter electrode may be a transparent electrode made of polysilicon, tin oxide, indium oxide or like substances, or it may be a combination of a metal electrode and a transparent electrode. A transparent protective film 6 is formed on the upper surface of the epitaxial layer 12 to introduce light rays into the optically active region. In the operative state of the photo-transistor, the region located in the vicinity of the base-collector junction which is reversely biased constitutes the main optically active region, so that it is desirable to arrange both the n type emitter region 14 and the p type base region 13 to have a small thickness so as not to cause substantial attenuation of the incident light. It is needless to say that a light-receiving window can be formed on the collector side.

When the amount of the incident light is zero, it will be noted that, even the application of a voltage between the emitter and the collector regions, will be normally result in no flow of current since the base bias voltage or base current is zero. As the amount of the incident light increases, electron-hole pairs are generated due to the incident light, and the carriers (positive holes) which have been collected in the base region will forward bias the base region to form a base current. As a result, a collector current will flow which is $h_{FE}$ times the base current. That is, the input of light and the output of current are almost in linearly proportional relationship. In order to cause a large current to flow, the area of light-receiving surface may be enlarged to increase the amount of the incident light. It will be effective also to focus the light rays by a lens onto the photo-transistor in a manner as stated previously. It is also possible to connect two photo-transistors in a Darlington configuration to increase the output current.

A bipolar photo-transistor has a rather big temperature dependence, and therefore it is desirable to perform temperature compensation especially when this photo-transistor is used outdoors. This temperature compensation may be performed within the respective display units, or it may be effected at the power supply source for the entire display device.

The static induction transistor (SIT) which has been proposed by one of the inventors, J. NISHIZAWA, has a small channel length, and has a very small series resistance from the source electrode up to the intrinsic gate (pinch-off point) within the channel. Thus, it is suited for large-current operation. In the reverse gate bias operation, the SIT exhibits a non-saturating characteristic based, fundamentally, on the control of the height of the potential barrier of the intrinsic gate by both of the gate and drain voltages. However, by appropriate selection of the structural parameters, it is possible to modify the non-saturating characteristic in various ways. By either increasing the series resistance to a certain degree or by connecting to the SIT an external resistance, it is also possible to modify the non-saturating characteristic to approach a saturating characteristic.

Furthermore, if a junction SIT is modified to operate with a forward gate bias, this SIT exhibits a saturating characteristic. That is, there will arise minority carrier injection from the forward biased gate region into the channel region. The minority carriers induce the injection of majority carriers from the source region. If the source region is separated from the gate region, the abovementioned effect is not exhibited so prominently. If, however, the gate region is disposed very close to the source region, the drain current will sharply rise by the application of a very small gate voltage, and will soon saturate perfectly. In FIG. 2C is shown a structure wherein such modified junction SIT is made into an optical device.

In FIG. 2C, an n⁻ type epitaxial layer 17 is formed on top of an n⁺ type silicon substrate 16. On the upper surface of this n⁻ type epitaxial layer 17 are formed an n⁺ type source region 18 and a p⁺ type gate region 19 by relying on either the diffusion technique or the ion-implantation technique. The n⁺ type substrate serves as the drain region. That portion of the n⁻ type epitaxial layer 17 which is sandwiched by the gate region 19 serves as the effective channel region 21. On the entire surface of the drain region 16 is formed a drain electrode 16′, and locally on the surface of the source region 18 is formed a source electrode 18′. Above the epitaxial layer 17 is formed a transparent protective film 20.

Figure 2D:
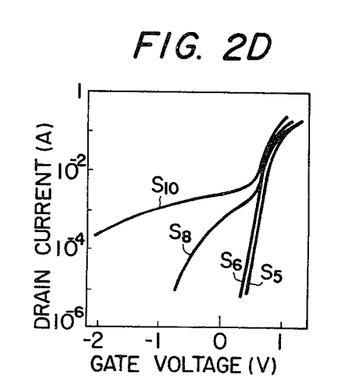
FIGS. 2D and 2E are diagrams for explaining characteristics of unipolar photo-transistor shown in FIG. 2C.
Figure 2E:
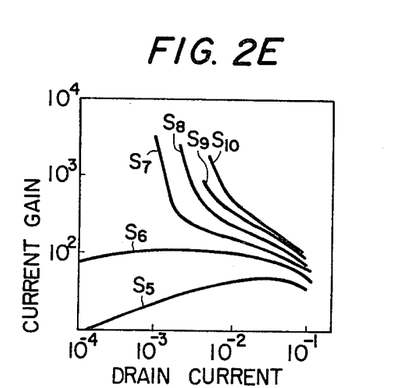

In an SIT structure which has adopted such vertical structure as stated above and which has a very short channel length, the configuration of the depletion layer is strongly subject to the influence of not only the gate region but also the source region and the drain region. There have been conducted measurement of electrical characteristics of such SIT's which are arranged so that the impurity concentration of the epitaxial layer 17 is selected at about $3.6 \times 10^{13}$ cm$^{-3}$, the length (thickness) of this epitaxial layer 17 at about 4.7 μm, the depth of the source region at about 0.5 μm, and the depth of the gate region at about 2.6 μm, and have the window-to-window distance of the gate mask (hereinafter to be referred to as gate-to-gate interval) varied progressively between 5 to 10 μm, and are provided with gate electrode. The result of this experiments is shown in FIGS. 2D and 2E. Symbols $S_5$, $S_6$, -, $S_{10}$ represent specimens having the gate mask distances of 5, 6, -, 10 μm, respectively. It is noted that, with the impurity concentration of $3.6 \times 10^{13}$ cm$^{-3}$, there will be formed a depletion layer of about 5.2 μm only by the built-in potential, according to the abrupt junction approximation. Accordingly, for a gate-to-gate interval of about 10 μm or smaller, it may be approximated that the channel will be pinched off by the depletion layer which is produced by the gate-to-channel built-in potential. Furthermore, owing to lateral diffusion occurring at the time of diffusion of the gate region, the channel width is rendered narrower than the gate-to-gate interval d. Accordingly, it is considered that the actural channel width d′ is considerably smaller than the window-to-window distance d of the gate mask.

FIG. 2D shows the drain current (in amperes) versus the gate voltage (in volts) relationship when the source-drain voltage is 1 volt. From this Figure, it will be noted that, in the state that a voltage is applied to the drain electrode, there is a flow of current even when the gate electrode is held at zero potential, excepting the instance wherein the gate-to-gate interval is considerably narrow. If the gate-to-gate interval is fairly large, the drain current will rise slightly with an increase in the forward gate voltage. Beyond a certain value of this voltage, the drain current sharply rises and will quickly saturate soon. The drain current to drain voltage characteristic was found to show a very sharp rise and almost perfect saturation at very low drain voltages. This abrupt increase in the current is considered to be attributed to the effect of carrier injection from the gate region. Also, the saturation of the current is considered to be due to the saturation of the majority carriers which can be derived from the source region through that channel region located on the source side to the drain side channel region. It will be obvious to those skilled in the art that, either by elevating the impurity concentration of the channel region or by widening the gate-to-gate interval, it is possible to increase the drain current at zero gate voltage. Conversely, in order to decrease the drain current at zero gate voltage, it is only necessary to narrow the gate-to-gate interval or to lower the impurity concentration of the channel region. When the gate region is forward biased relative to the source region, a gate current flows. FIG. 2E shows the ratio between the drain current and the gate current (which will be called current gain or current amplification factor, hereinafter). In the case of a narrow gate-to-gate interval, the current gain exhibits a characteristic analogous to the current gain exhibited by a bipolar transistor, and this characteristic of current gain is substantially constant for a considerably broad range of gate voltage applied. In the case of a large gate-to-gate interval, the current gain is relatively constant as in the case of narrow gate-to-gate interval, in the operating region where the drain current is large. As the drain current becomes small, however, the current amplification factor will increase greatly. That is, in the operating region where the forward bias gate voltage is high and where a large current flows, a drain current which is substantially proportional to the gate current is provided. However, even in such operating region wherein the gate voltage is close to zero and where no or very small gate current is allowed to flow, a certain drain current still flows. The magnitude of the current which is allowed to flow at zero gate bias is determined substantially by the impurity concentration distribution in the neutral channel region between the source and the drain regions and the dimensions of this neutral channel region. The magnitude of the current which is allowed to flow at a forward bias gate voltage is determined substantially by the dimensions and the impurity concentrations of the source region, the channel region and the gate region. Accordingly, it is possible to determine the current which flows at zero gate voltage almost independently of the current which is allowed to flow at a predetermined forward gate voltage.

If the gate region is electrically floated and a light is caused to impinge into the channel region, an electromotive force will be generated, by those photo-ionized carriers, in the diode structure constituted by the gate region and the channel region. When the gate region is sufficiently forward biased by such optically ionized carriers and when, thus, there begins to flow a forward gate current, a drain current of a magnitude multiplied by the current amplification factor of the gate current starts to flow. That is, as the ambient brightness increases, there flows a current which is substantially proportional to this brightness. When the ambient brightness increases markedly, the rate of the increase in the current flow will become less. By approximately selecting the impurity concentration of the channel region and the gate-to-gate interval in the structure of FIG. 2C, a predetermined amount of current will flow even when the ambient brightness drops to zero.

The basic structures of the static induction phototransistor shown in FIG. 2C and the field effect phototransistor shown in FIG. 1B are analogous. However, the SIT phototransistor has the advantages that the utility of the substrate is high, and that high sensitivity to light and large current and high speed operation can be obtained because of the vertical type structure, the very small channel length, the small gate region and the low impurity concentration of the channel region. Moreover, the SIT phototransistor provides a nearly linear brightness-current relationship when the ambient brightness is high. Accordingly, the static induction phototransistor is most suited for controlling the current flow of light-emitting diode display devices.

That is, a unipolar photo-transistor which is designed to control the drain current by a forward gate current is suitable for the control of light-emitting diode display devices. It should be understood that, since those carriers which are injected from the gate region toward the drain region (not through the effective channel region) hardly contribute to the formation of the main current, the current amplification factor can be further improved by reducing that surface area of the gate region which faces the drain region. For example, it is possible also to render the bottom face of the gate region in to a high resistive area or to semi-insulating area by relying on, for example, the oxygen ion implantation technique. It is also very effective to form a recess surrounding the channel region and to form a gate region on the side surface of this recess.

Though not shown in FIGS. 2D and 2E, the drain current of the forwardly biased static induction phototransistor can almost perfectly saturate for a low drain voltage e.g. around 100 to 200 mV.

As stated above, by the employment of a current-saturating type photo-transistor in the current-controlling unit CC-U shown in FIG. 1A, it is possible to perform both the control of the amount of emitting light to follow the ambient brightness, and also the absorption of the excess voltage, at the same time.

If a series train of light-emitting diodes connected in series in a single direction as shown in the circuit of FIG. 1A is driven by an alternating current source, the train of diodes will be inoperative for one half cycle of the respective cycles.

Figure 3A:
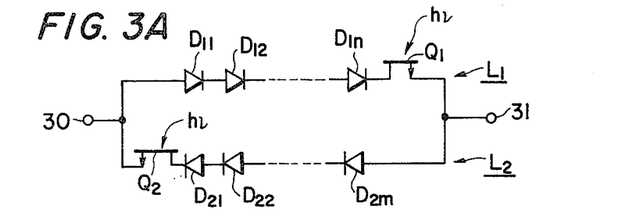
FIGS. 3A to 3E are circuit diagrams of various ambient light-responsive light-emitting diode display units according to other embodiments of the present invention.
Figure 3B:
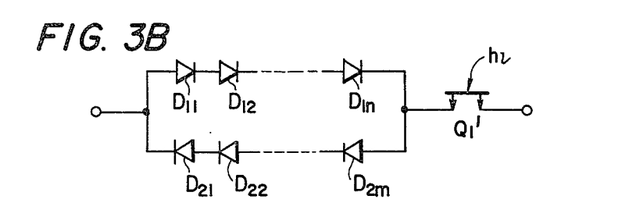

FIGS. 3A and 3B show the instances wherein there are employed a plurality of series connections of light-emitting diodes and so arranged that, when these series connections are ac-driven, the overall device will provide a luminous display with no dead half cycle.

FIG. 3A shows an example wherein two circuits, each comprising a series connection of light-emitting diodes and a current-controlling elements, are connected in parallel in opposite directions relative to each other. In this example, a field effect photo-transistor is used to serve as a light-responsive current-controlling means. Of course, other types of light-responsive current-controlling means, such as a bipolar photo-transistor or a static induction photo-transistor, may be used. When the terminal 30 is at a positive potential, the line $L_1$ is forward biased, causing line $L_1$ to emit light. However, the line $L_2$ is reversely biased, and therefore is not turned "on". When, however, the terminal 31 is rendered to a positive potential, the line $L_2$, conversely, will be forward biased and will emit light, whereas the line $L_1$ is reverse biased and will not emit light.

The circuit shown in FIG. 3A is such that the light-responsive current-controlling means also has directional property like light-emitting diodes. However, an embodiment wherein a bidirectional light-responsive current-controlling means is employed is shown in FIG. 3B. It is usual that a photo-conductive element does not have any directional property, and thus it can be used as a bidirectional element. It should be noted also that a photo-transistor, when it is formed into a symmetrical structure, will have bidirectional property. By the adoption of these symmetrical light-responsive current-controlling (limiting) elements, there can be obtained a light-responsive current-controlling means which is capable of controlling bidirectional currents by the amount of the incident light. In the embodiment of FIG. 3B, a bidirectional light-responsive current-controlling means is formed by a field effect photo-transistor. In FIGS. 3A and 3B, symbols $D_{11},-,D_{1n}$ and $D_{21},-,D_{2m}$ represent light-emitting diodes, and symbols $Q_1$, $Q_2$ and $Q_1'$ represent field effect photo-transistors, respectively.

Arrangement may be provided so that the series connection of diodes $D_{21},-,D_{2m}$ are to emit light different in color from that of the light emitting from the other series connection of diodes $D_{11},-,D_{1n}$. In such a instance, it will be understood that the current-voltage characteristic of the field effect photo-transistors $Q_1$ and $Q_2$ may be arranged to be positively different from each other, or that the bidirectional current-voltage characteristic of the field effect photo-transistor $Q_1'$ may be positively arranged to be different in the two directions. In the circuits of FIGS. 1A, 3A and 3B, it will be obvious to those skilled in the art to replace one series connection of diodes of one polarity by a parallel connection of a plurality of series connections of diodes of the same polarity.

As stated above, there can be adopted various kinds of light-responsive current-controlling means. Particularly, the employment of a photo-transistor having a saturating current characteristic is especially desirable.

Figure 3C:
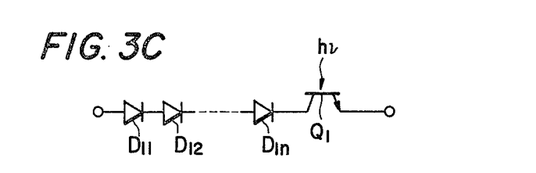
Figure 3D:
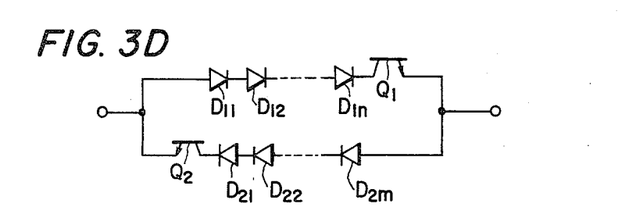
Figure 3E:
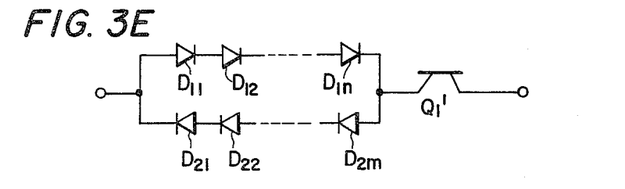

Embodiments employing a bipolar photo-transistor as shown in FIG. 2B as a photo-transistor are illustrated in FIGS. 3C to 3E. FIG. 3C shows a unidirectional unit circuit. FIGS. 3D and 3E show bidirectional unit circuits, respectively. A bipolar photo-transistor is so operative that, when the incident light is zero, the collector current thereof also becomes zero, and when there is an incident light, allows the flow of a collector current which is $h_{FE}$ (current amplification factor) times as large as the base current, which is formed by that electric charge stored in and flowing out of the base region. In other respects, these embodiments are analogous with those embodiments stated above already, and therefore further explanation is omitted here. In order to ensure that emission of light continues even when the amount of the incident light is zero, it is necessary to construct, for example, the series connections of light-emitting diodes which are not controlled by the incident light. It will be apparent to those skilled in the art that similar circuits as those of FIGS. 1A, 3A and 3B can be constructed by the employment of static induction photo-transistors simply by replacing the field effect photo-transistor by a static induction photo-transistor as shown in FIG. 2C.

Description has been made hereinabove of phototransistors whose controlling electrodes are forwardly biased by an incident light. Hereunder will be described a unipolar photo-transistor which is so structured that the amount of the reverse bias of its controlling electrode is regulated (adjusted) by an incident light.

If an insulated electrode is provided on an ordinary junction gate, and if a reverse bias voltage is applied thereto externally, the effective bias voltage of the gate will be the sum of the external reverse bias voltage and the internal forward bias voltage due to the photo-electromotive force.

The reverse biased gate region establishes a wider depletion layer in the channel region. Thus, the manufacture of such devices becomes easier to some extent. Also, the reverse biased gate region can store more charge than no-biased gate region.

Figure 4A:
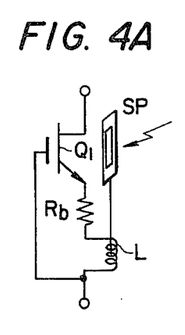
FIG. 4A is a circuit diagram of another embodiment.

FIG. 4A shows an embodiment of an insulated junction gate photo-transistor provided with an autobiasing resistance and a shutter means. An auto-biasing resistance $R_b$ is connected to a source region (or electrode) of an insulated junction gate photo-transistor $Q_1$ for establishing a bias voltage thereacross. The insulated electrode is connected to the other end of the auto-biasing resistance $R_b$. A shutter means is formed with a solenoid L and a shutter plate SP having a window. When there is no drain current, the shutter plate is pulled to one side and no light is incident on the transistor. When there is a drain current, the solenoid L is actuated to pull the shutter plate SP to the other side. A window in the shutter plate allows an incident light to impinge onto the photo-transistor for a certain period. This shutter mechanism can be compared with the focal plane shutter of a camera device. Carriers ionized by such incident light are stored in the gate region to modulate the total bias voltage, which is the sum of the voltage drop across the resistance $R_b$ and the voltage established by the light irradiation, i.e. charge stored in the gate region divided by the gate capacitance. It will be apparent that the insulated junction gate photo-transistor can be used in various other ways also. For example, it may be combined with other types of shutter means.

Figure 4B:
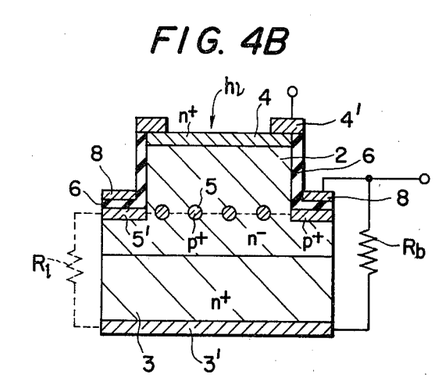
FIG. 4B is a cross-sectional view of a example of the modified unipolar photo-transistor shown in FIG. 4A.

A schematic structure of an insulated junction gate photo-transistor is shown in FIG. 4B. In the crosssectional view of FIG. 4B, the $n^+$ type substrate 3 is used as a source region, and on top of which is formed an $n^-$ type epitaxial layer 2. Within this epitaxial layer 2 are formed $p^+$ type embedded gate regions 5 and $p^+$ type gate lead-out regions 5'. On the upper surface of the epitaxial layer 2 is formed an $n^+$ type drain region 4. Electrodes 3' and 4' are formed on the source region 3 and the drain region 4, respectively. On the gate lead-out region 5' is formed an electrode 8 via an intervening insulating film 6 to constitute a capacitance for the transmission of a voltage. Between the gate electrode 8 and the source electrode 3' is formed a small biasing resistor $R_b$. Between the gate lead-out region 5' and either the source region 3 or the source electrode 3' may be formed an appropriate leakage resistor $R_l$, as shown by the dotted line. These resistors may be connected externally, or they may be formed integrally by such material as polysilicon. Arrangement is made here that external light is allowed to impinge on the drain side. This embodiment is so designed that a large current is obtained by increasing the number of the channels and by decreasing the channel length (meaning the gate length).

In place of the vertical type structure, there may be adopted a lateral structure as shown in FIG. 1B. With a lateral structure, it will be possible to improve the saturating current characteristic by, for example, increasing the channel length (gate length) to thereby increase the distance from the source region up to the intrinsic gate which acts to effectively control the current. Since the instant embodiment has a small channel length, this transistor resembles static induction transistor if the biasing resistor $R_b$ is removed. Thus, the transistor of this embodiment has been expressed as a static induction transistor. It should be noted, however, that this transistor can be made to act like an ordinary field effect transistor depending on the design parameters such as the impurity concentration and dimensions of the channel region. In case the biasing resistance $R_b$ is given a larger value, the voltage drop across the biasing resistance will increase, and the saturating characteristic will be more improved.

In the similar way, it will be possible also to construct a field effect photo-transistor having an insulated electrode on the controlling region. In such instance, it will be possible to arrange so that a required current will flow, by an appropriate selection of the biasing resistance $R_b$.

Figure 5A:
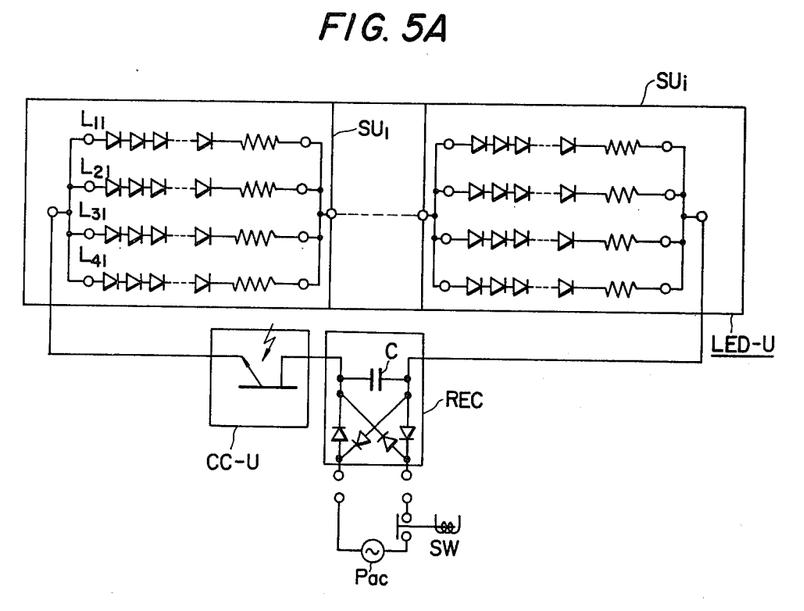
FIGS. 5A, 5B and 5C are a circuit diagram and a schematic cross sectional view of a light-emitting diode display device according to further embodiment of the present invention, and a circuit diagram of a modification of FIG. 5A.

In FIG. 5A is shown a concrete example of the present invention. This example represents a display device which is adapted to be operated by connection to an alternating current power supply source $P_{ac}$ through a switch SW, as in traffic signal lamp. This display device comprises a rectifying-smoothing circuit REC, a light-responsive current-controlling circuit unit CC-U, and a light-emitting diode circuit unit LED-U, connected in series. The rectifying-smoothing circuit REC includes rectifying diodes and a smoothing capacitance C. This capacitance C may be small, since ripple component, if not excessively large, will not cause a problem. The light-responsive current-controlling unit CC-U is formed by such saturating current type unipolar photo-transistor (shown as static induction photo-transistor as shown in FIG. 2C). The light-responsive current-controlling unit may also be formed by such photo-transistors as shown in FIG. 1B. The light-emitting diode unit LED-U is formed by a plurality of sub-units $SU_1$–$SU_i$ which are connected in series. Each sub-unit (e.g. $SU_1$) is comprised of a parallel connection of four unit circuits (e.g. $L_{11}$, $L_{21}$, $L_{31}$ and $L_{41}$). Each unit circuit L is comprised, further, of a series connection of a plurality of light-emitting diodes and a resistor. These resistors provide balancing between the unit circuits within the respective sub-units, and sets the operating characteristic.

Figure 5B:
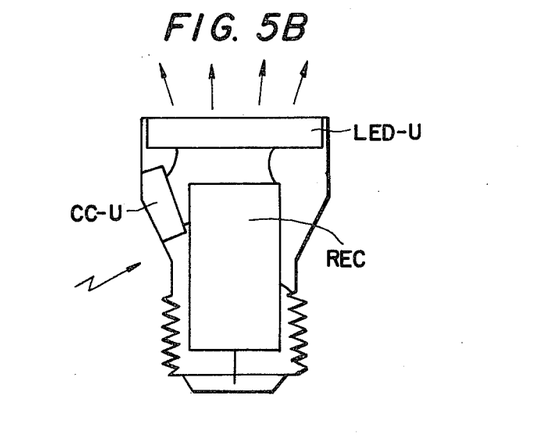

The whole display device may be assembled in a lamp-like housing. The light-emitting diode circuit unit LED-U may be disposed on the top portion, and the light-responsive current-controlling circuit unit CC-U may be disposed on the side surface as shown in FIG. 5B, or vice versa.

The current which is supplied from the current-controlling unit CC-U to the light-emitting diode unit LED-U is determined, in response to the ambient brightness and this current is allowed to flow while being divided into the four parallel circuits within the respective sub-units. Accordingly, a display suitable for the ambient brightness is provided. In the event that any one of the unit circuits is broken, the voltage which is applied to said one subunit will slightly rise. This will cause an increase in the amount of current flowing through the remaining unit circuits. However, the total current of the subunits, which is the sum of those currents flowing through these unit circuits will be maintained constant. As such, the total amount of emitting light will hardly alter even when a local disconnection takes place in the device.

Figure 5C:
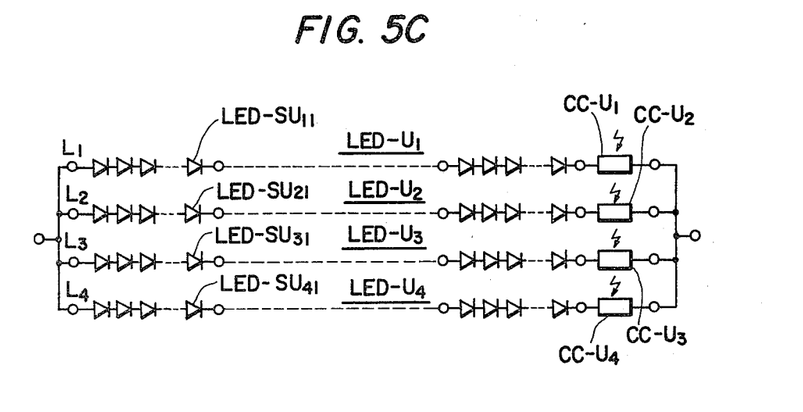

FIG. 5C shows another concrete example. This circuitry represents a simple parallel connection of four (4) rows each comprising a series connection of light-emitting diodes and a light-responsive current-controlling unit. This circuitry is either dc-driven as it is, or ac-driven by substituting for the light-emitting diode unit LED-U and the light-responsive current-controlling unit CC-U of FIG. 5A. A first light-emitting diode unit LED-$U_1$ and a first light-responsive current-controlling unit CC-$U_1$ are connected in series to form a first line $L_1$. The second, third and fourth lines $L_2$, $L_3$ and $L_4$ have similar arrangement. Each light-emitting diode unit LED-U is divided further into a plurality of individual light-emitting diode sub-units LED-SU to increase the freedom of designing of the display device. For example, by setting the operating voltage per light-emitting diode sub-unit at 20V, and by arranging the configuration into, for example, rectangular or hexagonal, it is possible to use the same light-emitting diode sub-unit for various different purposes, and moreover its replacement becomes easy. It is desirable to form the light-responsive current-controlling unit CC-U by a saturating current type photo-transistor.

When the light-emitting diode display device is assembled in a lamp-like shape, the lamp base may be positively utilized as a heat radiator to improve the heat-radiation of such portions as the current-controlling circuit and the rectifying circuit. The light-responsive current-controlling element may be provided within the same plane as that of the light-emitting surface, or it may be provided within some other plane. Anyway, it is desirable to provide this element at a site where the light from the light-emitting diode circuit does not impinge thereonto and where the ambient brightness can be monitored more adequately.

As explained above with respect to the embodiments, the light-emitting diode display device according to the present invention has a light-emitting diode circuit including a series connection of light-emitting diodes, and a light-responsive current-controlling circuit assigned to vary the drive current of the light-emitting diode circuit in response to the ambient brightness, and thereby provides a colored light luminous display that is adaptive to the ambient brightness. The display device of the present invention is simple in structure, has a very long lifetime, has very small power dissipation, and is low in the cost of maintenance.

Especially, by the adoption of a saturating current type photo-transistor in the light-responsive current-controlling circuit, it is possible to concurrently perform the light-responsive current control and prevent application of excess voltage to the light-emitting diode circuit is provided. Also, the adoption of a unipolar photo-transistor is especially effective since it allows the light-responsive current-control to be designed with great freedom.

The photo-transistor circuits as well as the light-emitting diode circuits are not limited to those illustrated and described above, and it should be understood that various modifications and improvements may be made thereto within the scope of the present invention and based on the spirit of this invention.

What is claimed is:

1. An outdoor-installed light-responsive diode display comprising:
   a light-emitting diode circuit including a plurality of light-emitting diodes connected in series for emitting a large amount of colored light; and
   a light-responsive current-controlling circuit responsive to intensity of ambient light and connected in series to said light-emitting diode circuit and including a light-responsive current-controlling element, responsive to said ambient light, for regulating current through said light emitting diode circuit, and varying current through said light-emitting diode circuit such that a larger current flows through said light-emitting diode circuit when exposed to a higher intensity of the ambient light.

2. An outdoor-installed light-responsive diode display comprising:
   a light-emitting diode circuit including a plurality of light-emitting diodes connected in series for emitting a large amount of colored light; and
   a light-responsive current-controlling circuit, responsive to intensity of ambient light, connected in series to said light-emitting diode circuit and including a light-responsive current-controlling element for allowing a large current to flow when exposed to illumination of a high intensity of lights;

said light-responsive current-controlling element having a saturating current versus voltage characteristic.

3. A light-emitting diode display according to claim 2, wherein: said light-emitting diode circuit includes a plurality of series connections of light-emitting diodes connected in parallel.

4. A light-emitting diode display according to claim 3, wherein: said light-responsive current-controlling circuit includes at least one light-responsive current-controlling element connected in series to at least one of said plurality of series connections.

5. A light-emitting diode display according to claim 4, wherein: said light-responsive current-controlling element is a bipolar photo-transistor.

6. A light-emitting diode display according to claim 2, wherein: said light-emitting diode circuit includes a plurality of series connections of light-emitting diodes, each being connected in series to said light-responsive current-controlling circuit.

7. A light-emitting diode display according to claim 6, wherein: said light-emitting diode circuit further includes a resistance connected in series to each of said series connections of light-emitting diodes for balancing the currents through respective series connections.

8. A light-emitting diode display according to claim 7, wherein: said light-responsive current-controlling element is a unipolar photo-transistor.

9. A light-emitting diode display according to claim 8, wherein: said unipolar photo-transistor includes a source region of one conductivity type and of a low resistivity, a channel region of said one conductivity type and having a low impurity concentration and disposed adjacent to said source region, a gate region of the other conductivity type opposite to said one conductivity type and of a low resistivity, and disposed adjacent to said channel region and near said source region so that carriers injected from the gate region into the channel region can easily reach the vicinity of said source region and can attractively induce injection of carriers of the opposite polarity therefrom, and a light-receiving window formed in the vicinity of said channel region for introducing incident light rays into the vicinity of said channel region.

10. A light-emitting diode display according to claim 8, wherein: said unipolar photo-transistor includes a source region for supplying carriers of one polarity, a channel region disposed adjacent to said source region for transmitting said carriers of one polarity as majority carriers, a gate region having an opposite conductivity type to that of said channel region and disposed adjacent to said channel region, and an insulated electrode formed on said gate region to form a capacitance therewith, and said light-responsive current-controlling circuit further includes a resistance connected between said source region and said insulated electrode of the photo-transistor.

11. A light-emitting diode display device comprising: a light-emitting diode circuit including a series connection of light-emitting diodes and a current-controlling circuit including a transistor having a source, a drain, a channel region and a gate region and being connected in series to said light-emitting diode circuit and having a window for introducing ambient light rays into said channel region and being operative so that the effective potential of said gate region varies in accordance with the intensity of the incident ambient light rays, to thereby vary the magnitude of the current to said light emitting diodes in accordance with ambient light.

12. A light-emitting diode display device according to claim 11, wherein: said light-emitting diode circuit includes a series connection of a plurality of sub-units, each of said sub-units including a parallel connection of a plurality of rows of light-emitting diodes, each of these rows of light-emitting diodes including series connection of a plurality of light-emitting diodes and a resistor.

13. A light-emitting diode display device according to claim 11 or 12, wherein: said light-emitting diode circuit includes a parallel connection of a series connection of a plurality of light-emitting diodes connected in series in a certain polarity, and a series connection of a plurality of light-emitting diodes connected in series in a polarity opposite to said certain polarity.

14. A light-emitting diode display device, comprising: a light-emitting diode circuit including a series connection of light-emitting diodes, and a current-controlling circuit including a photo-transistor having first and second semiconductor regions defining a current path therebetween and a photo-responsive portion for controlling current flow through said path, said path being connected in series to said light-emitting diode circuit.

15. A light-emitting diode display device according to claim 14, wherein: said light-emitting diode circuit includes a parallel connection of a series connection of a plurality of light-emitting diodes connected in series in a certain polarity, and a series connection of a plurality of light-emitting diodes connected in series to have a polarity opposite to said certain polarity.

16. A light-emitting diode lamp adapted for outdoor use comprising:
a housing including a lamp base having two terminals;
a front panel accommodated on the top of said housing and carrying a multiplicity of light-emitting diodes of a single color connected in series;
a photo-transistor accommodated at a side portion of said housing and connected in series to said multiplicity of light-emitting diodes for continuously controlling the intensity of output light in accordance with the ambient light;
the multiplicity of light-emitting diodes and the photo-transistor being optically isolated and electrically connected in series between the two terminals of said lamp base.

17. A light emitting diode lamp according to claim 16, further comprising means for rectifying and smoothing ac power having input terminals connected to the two terminals of said lamp base for receiving ac power and having output terminals connected to said multiplicity of light-emitting diodes and said photo-transistor for supplying rectified and smoothed electric power thereto.

18. A light-emitting diode display adapted for use in day and night ambient light conditions comprising:
light-emitting diode unit means including at least one set of a predetermined number of light emitting diodes electrically connected in series, for generating an amount of light in accordance with the magnitude of the current applied thereto;
ambient light responsive current-control means, electrically connected with said light-emitting diode unit means, for limiting the maximum magnitude of said current in accordance with the level of said ambient light; and
means for optically isolating said current control means from said light-emitting diode unit means.

19. The display of claim 18 wherein said light emitting diode unit means comprises a plurality of said sets of light emitting diodes electrically connected in parallel.

* * * * *